United States Patent
Lee et al.

(10) Patent No.: US 12,550,656 B2
(45) Date of Patent: Feb. 10, 2026

(54) METHOD FOR MANUFACTURING SEMICONDUCTOR DEVICE AND FORMING PHOTORESIST PATTERN

(71) Applicant: Samsung Electronics Co., Ltd., Suwon-si (KR)

(72) Inventors: Jieun Lee, Suwon-si (KR); Jinpyoung Kim, Suwon-si (KR); Jieun Song, Suwon-si (KR); Janghoon Kim, Suwon-si (KR); Woojin Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 179 days.

(21) Appl. No.: 18/321,378

(22) Filed: May 22, 2023

(65) Prior Publication Data

US 2024/0153755 A1     May 9, 2024

(30) Foreign Application Priority Data

Nov. 3, 2022   (KR) .................... 10-2022-0145394

(51) Int. Cl.
| | | |
|---|---|---|
| *H01L 21/02* | (2006.01) | |
| *B08B 3/08* | (2006.01) | |
| *H01L 21/027* | (2006.01) | |
| *H01L 21/311* | (2006.01) | |
| *H01L 21/3213* | (2006.01) | |
| *G03F 7/40* | (2006.01) | |

(52) U.S. Cl.
CPC .......... *H01L 21/0206* (2013.01); *B08B 3/08* (2013.01); *H01L 21/027* (2013.01); *H01L 21/31144* (2013.01); *H01L 21/32139* (2013.01); *G03F 7/40* (2013.01)

(58) Field of Classification Search
CPC .............. H01L 21/0206; H01L 21/027; H01L 21/31144; H01L 21/32139; H01L 21/0274; H01L 21/02057; B08B 3/08; G03F 7/40; G03F 7/32; G03F 7/00; G03F 7/422; G03F 7/322
USPC ........................................................ 438/694
See application file for complete search history.

(56) References Cited

U.S. PATENT DOCUMENTS 5,374,502 A    12/1994   Tanaka et al.
7,977,039 B2    7/2011   Shimoaoki et al.
(Continued)

FOREIGN PATENT DOCUMENTS

CN         101313385 A  *  11/2008  ............... C11D 1/66

OTHER PUBLICATIONS

Science Direct, Ionic Surfactant—an overview (Year: 2019).*
(Continued)

*Primary Examiner* — Duy Vu N Deo
(74) *Attorney, Agent, or Firm* — Wolf, Greenfield & Sacks, P.C.

(57) ABSTRACT

A method of manufacturing a semiconductor device includes: forming a pattern formation material layer on a substrate; forming a photoresist on the pattern formation material layer; exposing and developing the photoresist to form a photoresist pattern; performing a first deionized water cleaning on the photoresist pattern; cleaning the photoresist pattern with a cleaning solution including a surfactant; and performing a second deionized water cleaning on the photoresist pattern.

19 Claims, 13 Drawing Sheets

(56) References Cited

U.S. PATENT DOCUMENTS

| | | | |
|---|---|---|---|
| 8,367,312 B2 | 2/2013 | Sawada et al. | |
| 9,551,936 B2* | 1/2017 | Kehren | G03F 7/405 |
| 10,468,250 B2 | 11/2019 | Kim et al. | |
| 2004/0204328 A1* | 10/2004 | Zhang | G03F 7/091 |
| | | | 510/175 |
| 2005/0250054 A1 | 11/2005 | Chang | |
| 2005/0284502 A1 | 12/2005 | Watanabe et al. | |
| 2008/0280230 A1 | 11/2008 | Chang et al. | |
| 2013/0040246 A1* | 2/2013 | Kawakami | G03F 7/3021 |
| | | | 118/75 |
| 2014/0057437 A1 | 2/2014 | Kozawa et al. | |
| 2021/0358751 A1* | 11/2021 | Gao | H01L 21/0337 |

OTHER PUBLICATIONS

Science Direct, Anionic Surfactant—an overview (Year: 2020).*
Science Direct, The Multiple Origins of the Hydrophobicity of Fluorinated Apolar Amino Acids (Year: 2017).*
Britannica, Hydroxyl group | Definition, Structure, & Facts (Year: 2025).*

* cited by examiner

METHOD FOR MANUFACTURING SEMICONDUCTOR DEVICE AND FORMING PHOTORESIST PATTERN

CROSS-REFERENCE TO RELATED APPLICATION

This application claims priority to and the benefit of Korean Patent Application No. 10-2022-0145394 filed in the Korean Intellectual Property Office on Nov. 3, 2022, the entire contents of which are incorporated herein by reference.

BACKGROUND

1. Field

The present disclosure relates to a method of manufacturing a semiconductor device and forming a photoresist pattern.

2. Description of the Related Art

A semiconductor is a material that belongs to an intermediate region between a conductor and an insulator, and conducts electricity under predetermined conditions. Various semiconductor devices may be manufactured using a semiconductor material, and for example, memory devices and the like may be manufactured. These semiconductor devices may be used in various electronic devices.

According to a trend of downsizing and higher integration of the electronic devices, it may be desirable to finely form patterns for the semiconductor devices. These fine patterns may be formed through a photo process, and it may be desirable to form fine photoresist patterns used in the photo process.

In this way, when the pattern is finely formed, a difference in a shape or size may occur between a plurality of patterns formed that are identically designed. For example, a problem may occur in which the width of the pattern formed by being designed with a bar shape having a predetermined width is not constant.

SUMMARY

Embodiments are intended to provide a method of manufacturing a semiconductor device capable of improving the uniformity of a line width of a pattern.

In some embodiments of the present inventive concept, a method of manufacturing a semiconductor device according to an embodiment includes: forming a pattern formation material layer on a substrate; forming a photoresist on the pattern formation material layer; exposing and developing the photoresist to form a photoresist pattern; performing a first deionized water cleaning on the photoresist pattern; cleaning the photoresist pattern with a cleaning solution including a surfactant; and performing a second deionized water cleaning on the photoresist pattern.

In some embodiments, the surfactant may be an acidic negative ionic surfactant.

In some embodiments, the surfactant may include a hydrophobic tail, and a hydrophilic head.

In some embodiments, the photoresist pattern may be hydrophobic, the hydrophobic tail of the surfactant may be bonded to the photoresist pattern, and the hydrophilic head of the surfactant may extend away from the photoresist pattern.

In some embodiments, the cleaning solution including the surfactant may further include water and an additive, a water content may be 99% or more, and the additive may be a hydrocarbon additive.

In some embodiments, the step of exposing and developing the photoresist to form a photoresist pattern comprising developing the photoresist using a developer comprising a basic aqueous solution.

In some embodiments, an upper surface of the photoresist pattern formed by developing the photoresist may be basic.

In some embodiments, the upper surface of the photoresist pattern after the first deionized water cleaning may be neutral.

In some embodiments, the upper surface of the photoresist pattern after cleaning the photoresist pattern with a cleaning solution including the surfactant may be acidic.

In some embodiments, the upper surface of the photoresist after the second deionized water cleaning may be neutral.

In some embodiments, a pH of the upper surface of the photoresist pattern after cleaning using the cleaning solution including the surfactant may be different depending on a location on the substrate.

In some embodiments, a pH of the upper surface of the photoresist pattern in a center region of the substrate may be lower than a pH of the upper surface of the photoresist pattern on an edge region of the substrate.

In some embodiments, a pH of the upper surface of the photoresist pattern after the second deionized water cleaning may be constant regardless of a location on the substrate.

In some embodiments, a method of manufacturing the semiconductor device may further include, after performing the second deionized water cleaning, drying the photoresist pattern and performing a hard bake process thereon.

In some embodiments, the hard bake process may take place about 60° C. or more, and below about 110° C.

In some embodiments, the hard bake process may take place above about 80° C. or more, and below about 100° C.

In some embodiments, the method of manufacturing the semiconductor device, after performing the hard bake process, may further include etching the pattern formation material layer by using the photoresist pattern as a mask, and removing the photoresist pattern.

According to some embodiments of the present inventive concepts, a photoresist pattern forming method may include forming a photoresist on a substrate, exposing and developing the photoresist to form a photoresist pattern, performing a first deionized water cleaning on the photoresist pattern, cleaning the photoresist pattern with a cleaning solution including a surfactant, and a performing second deionized water cleaning on the photoresist pattern.

In some embodiments, the surfactant may be an acidic negative ionic surfactant.

In some embodiments, the photoresist pattern forming method may further include drying the photoresist pattern and performing a hard bake process after performing the second deionized water cleaning.

According to some embodiments of the present inventive concepts, a method of manufacturing a semiconductor device includes forming a pattern formation material layer on a substrate; forming a photoresist on the pattern formation material layer; exposing and developing the photoresist to form a photoresist pattern; performing a first deionized water cleaning on the photoresist pattern; after the first deionized water cleaning on the photoresist pattern, further cleaning the photoresist pattern with a cleaning solution including a surfactant; and after the cleaning the photoresist pattern with the cleaning solution including the surfactant, performing a second deionized water cleaning on the photoresist pattern.

According to embodiments, the uniformity of the line width of the pattern of the semiconductor device may be improved.

DETAILED DESCRIPTION

Figure 1:
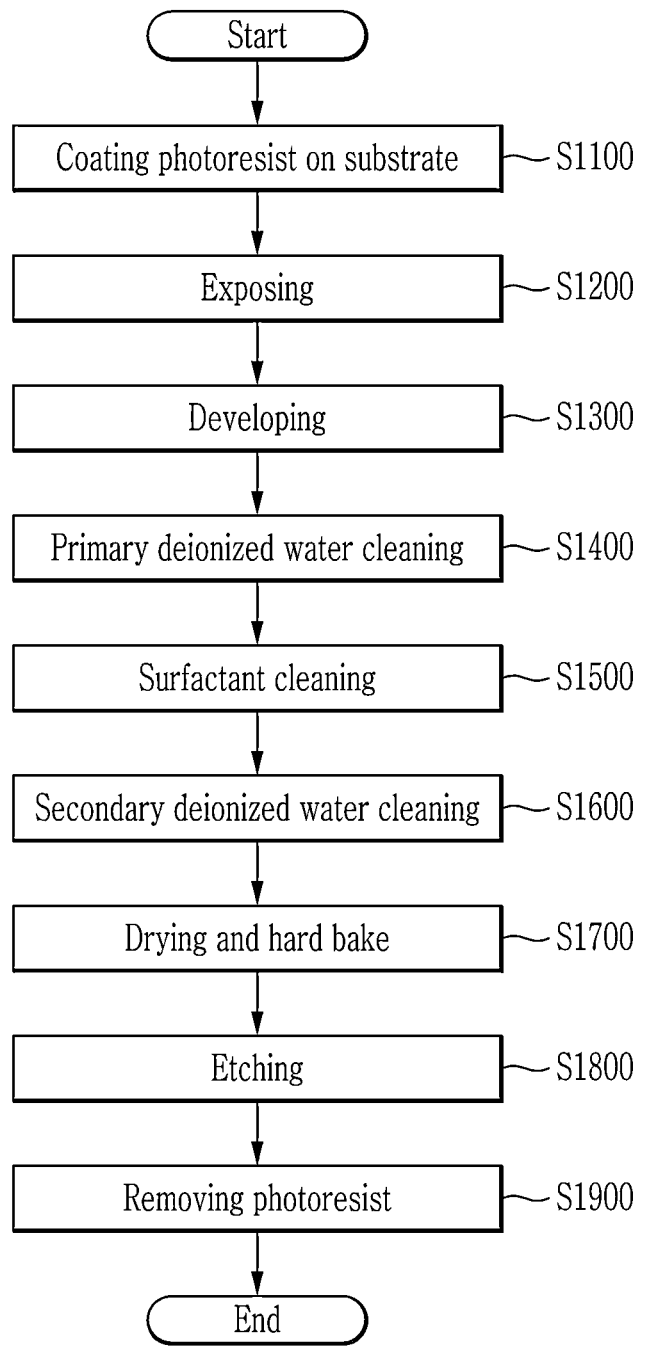
FIG. 1 is a flowchart showing a method of manufacturing a semiconductor device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to clarify the present invention, parts that are not connected with the description will be omitted, and the same elements or equivalents are referred to by the same reference numerals throughout the specification.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" means when an object portion is viewed from above, and the phrase "on a cross-section" means when a cross-section taken by vertically cutting an object portion is viewed from the side.

Hereinafter, a method of manufacturing a semiconductor device according to an embodiment is described with reference to FIG. 1 to FIG. 10B.

FIG. 1 is a flowchart showing a method of manufacturing a semiconductor device according to an embodiment, and FIG. 2A to FIG. 10B are views sequentially showing a method of manufacturing a semiconductor device according to an embodiment. FIG. 2A to FIG. 10A are process top plan views, and FIG. 2B to FIG. 10B are process cross-sectional views taken along a line X-X' of FIG. 2A to FIG. 10A, respectively.

Figure 2A:
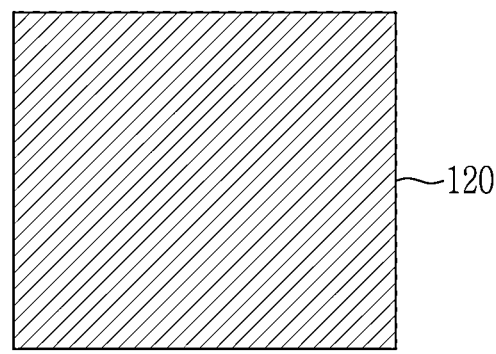
FIG. 2A to FIG. 10B are views sequentially showing a method of manufacturing a semiconductor device according to an embodiment.
Figure 2A:
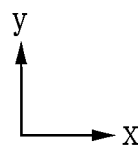
Figure 2B:
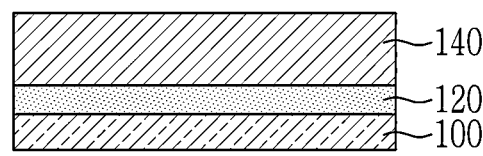
Figure 2B:
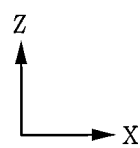

As shown in FIG. 1, FIG. 2A, and FIG. 2B, a photoresist 140 is coated on a substrate 100. (S1100)

First, after forming a pattern formation material layer 120 on the substrate 100, a photoresist 140 may be formed on the pattern formation material layer 120, e.g., such that the pattern formation material layer 120 is coated by the photoresist 140.

The substrate 100 may include a semiconductor material. For example, the substrate 100 may include an IV Group semiconductor, an III-V Group compound semiconductor, an II-VI Group compound semiconductor, and the like. For example, the substrate 100 may be a silicon substrate, a germanium substrate, a silicon-germanium substrate, or a silicon-on-insulator (SOI) substrate. The substrate 100 may have a top surface parallel to a first direction (an x direction) and a second direction (a y direction), and a thickness parallel to a third direction (a z direction) perpendicular to the first direction (the x direction) and the second direction (the y direction).

The pattern formation material layer 120 may include a conductive material or an insulating material. For example, the pattern formation material layer 120 may include a metal, an alloy, a metal carbide, a metal nitride, a metal oxynitride, a metal oxycarbide, a semiconductor material, polysilicon, a silicon oxide, a silicon nitride, or a silicon oxynitride. The pattern formation material layer 120 may consist of a single layer or multiple layers. Another layer may be further positioned between the substrate 100 and the pattern formation material layer 120. In addition, another layer may also be further positioned between the pattern formation material layer 120 and the photoresist 140.

The photoresist 140 includes a photosensitive resin material that undergoes a chemical change when being irradiated with light. The photoresist 140 is a positive type in which the light irradiated part is removed and a negative type in which the light irradiated part remains. The photoresist 140 may be formed using various methods such as a spin coating, a spray coating, and a dip coating. The photoresist 140 may be entirely formed on the substrate 100.

Subsequently, after forming the photoresist 140, a soft bake process may be performed. The soft bake process may proceed at about 110° C.

Figure 3A:
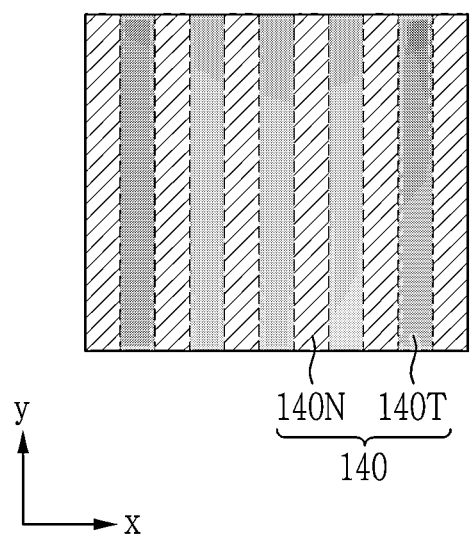
Figure 3B:
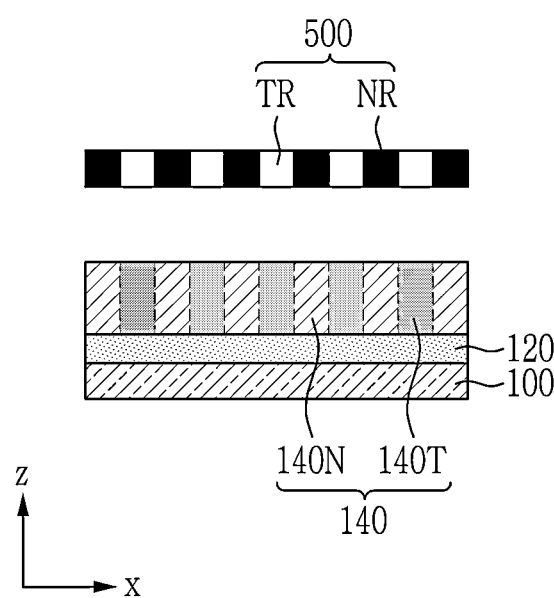

As shown in FIG. 1, FIG. 3A, and FIG. 3B, a mask 500 corresponds to the substrate 100 on which the photoresist 140 is formed, and then an exposure process may be performed by irradiating light. (S1200)

The mask 500 may include a transmissive region TR and a non-transmissive region NR. The irradiated light may pass through the transmissive region TR of the mask 500 and reach a partial region 140T of the photoresist 140. Light does not pass through a portion corresponding to the non-transmissive region NR, and light may not reach another portion region 140N of the photoresist 140.

Light of various wavelengths may be used in the exposure process. For example, the exposure process may be performed using a light source with an ultraviolet (UV) (EUV) wavelength.

Figure 4A:
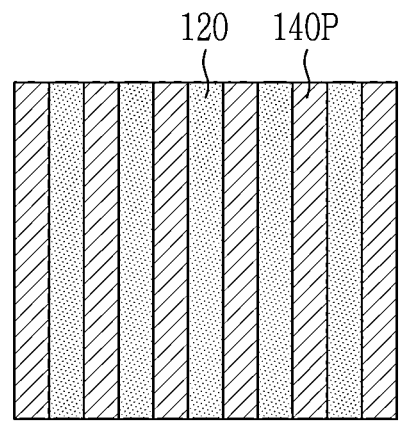
Figure 4A:
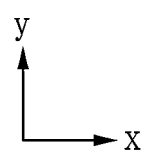
Figure 4B:
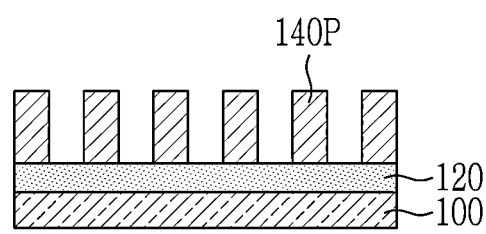
Figure 4B:
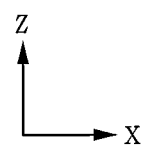

As shown in FIG. 1, FIG. 4A, and FIG. 4B, a photoresist pattern 140P is formed by developing the photoresist 140 that has undergone the exposure process. (S1300)

In the developing process, the photoresist 140 may be developed using a developing solution. The developing solution may include or consist of a basic aqueous solution. For example, the developer may consist of an aqueous solution of TMAH (tetramethyl ammonium hydroxide). At this time, the TMAH aqueous solution may have a concentration of about 2 to 5 wt %. At this time, the development process may be performed for about 10 to 100 seconds by supplying the TMAH aqueous solution to the exposed photoresist 140. The material and concentration of the developing solution, and the duration of the developing process, are only examples and may be changed in various ways.

When the developing process proceeds, some regions 140T of the photoresist 140 irradiated with light are removed, and some regions 140N of the photoresist 140 that are not irradiated with light remain, thereby forming a photoresist pattern 140P. As the portion of the photoresist 140 is removed, at least a portion of the upper surface of the pattern formation material layer 120 positioned below the photoresist 140 may be exposed. Although the case where the photoresist 140 is made of a positive type has been described above, it is not limited thereto, and the photoresist 140 may be made of a negative type. When the photoresist 140 is formed of a negative type, some regions 140T of the photoresist 140 to which light is irradiated may remain, and other portions of regions 140N of the photoresist 140 to which light is not irradiated may be removed.

The developer used in the development process is basic, and the pH of the developer may be about 12 to about 14. For example, the pH of the developer solution may be about 13.5. Accordingly, the upper surface of the photoresist pattern 140P where the development process has been performed may be basic. The pH of the upper surface of the photoresist pattern 140P may be from about 9 to about 11. For example, the pH of the upper surface of the photoresist pattern 140P may be about 10.

Figure 5A:
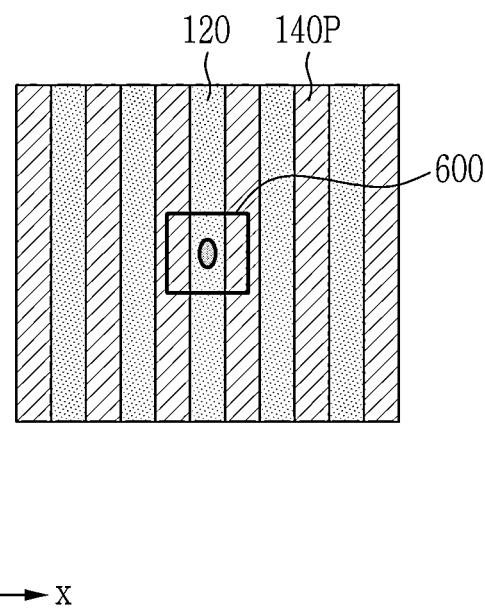
Figure 5B:
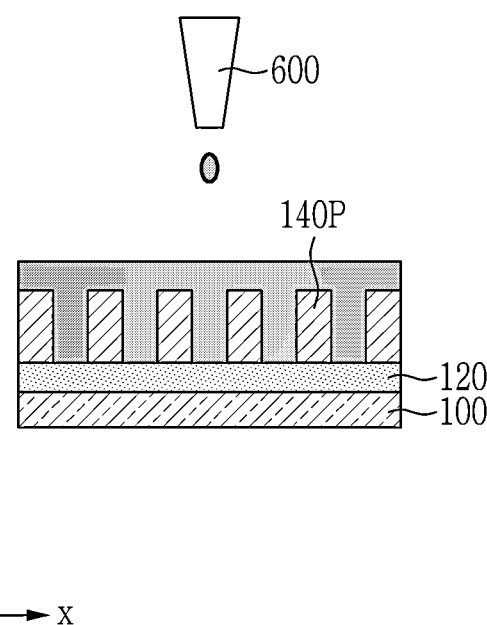

As shown in FIG. 1, FIG. 5A, and FIG. 5B, a first deionized water (DIW) cleaning process is performed on the photoresist pattern 140P where the developing process has been performed. (S1400)

A nozzle 600 capable of supplying deionized water is placed on the substrate 100 on which the photoresist pattern 140P is formed. The nozzle 600 may correspond to the center of the substrate 100. Subsequently, while rotating the substrate 100 in a certain direction, the deionized water may be supplied from the nozzle 600 onto the substrate 100. At this time, the deionized water cleaning process may proceed for about 1 second to about 30 seconds. For example, the deionized water cleaning process may run for about 1.5 seconds. Also, the substrate 100 may be rotated at speeds of about 200 to about 2000 rpm. However, the supply time of the deionized water, the supply method, the rotation speed of the substrate 100, etc. are not limited thereto and may be variously changed. For example, the supply method of the deionized water may be made by a method such as spraying or dipping.

The deionized water is neutral, and the pH of the deionized water may be about 7. Accordingly, the upper surface of the photoresist pattern 140P subjected to the first deionized water cleaning process may be neutral. The pH of the upper surface of the photoresist pattern 140P may be about 6 to about 8. For example, the pH of the upper surface of the photoresist pattern 140P may be about 7.

Figure 6A:
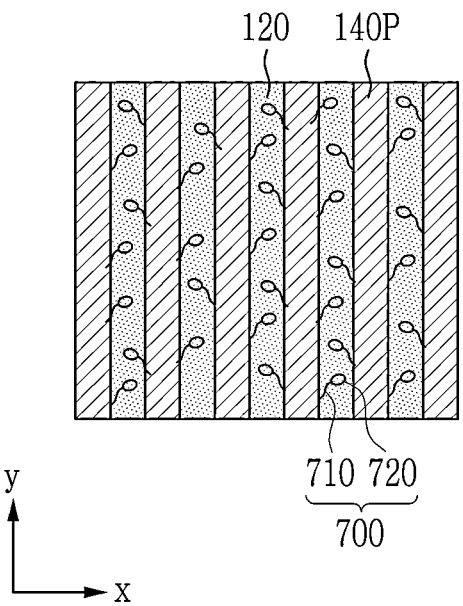
Figure 6B:
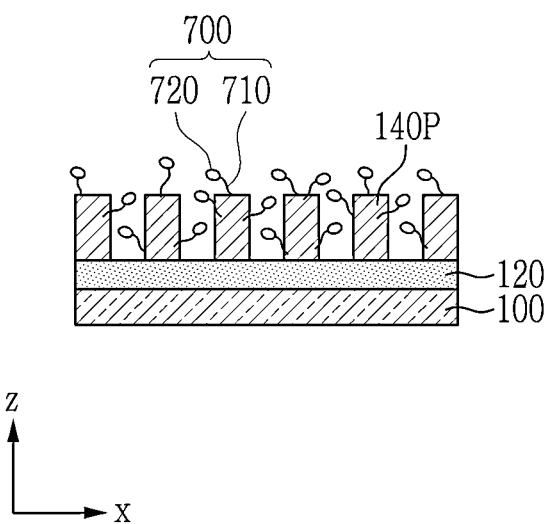

As shown in FIG. 1, FIG. 6A, and FIG. 6B, a cleaning process using a cleaning solution including a surfactant 700 is performed on the photoresist pattern 140P where the first deionized water cleaning process was performed. (S1500)

The cleaning process may be performed by supplying a cleaning solution including the surfactant 700 to the substrate 100 on which the photoresist pattern 140P is formed. The cleaning solution may be supplied to the center of the substrate 100, and the cleaning solution may be supplied while rotating the substrate 100 in a certain direction. The cleaning process using a cleaning solution containing the surfactant 700 may be performed for about 5 seconds. The supply method or supply time of the cleaning solution including the surfactant 700 may be changed in various ways.

The cleaning solution may include water, the surfactant, and additives. At this time, the content of water included in the cleaning solution may be about 99% or more. The surfactant 700 may be an acidic negative ionic surfactant, and the additive may be a hydrocarbon additive. The cleaning solution may be slightly acidic, and the pH of the cleaning solution may be from about 2.5 to about 3.5. For example, the pH of the cleaning solution may be about 3. The boiling point of the cleaning solution is about 100° C., which may be similar to the boiling point of water. The surface tension of the cleaning solution is about 47 mN/m, which may be smaller than the surface tension of water, which is about 72 mN/m. However, the characteristics of this cleaning solution are not limited thereto and may be variously changed. The acidic negative ionic surfactant 700 may include a hydrophobic tail 710 and a hydrophilic head 720. The photoresist pattern 140P may have hydrophobicity, and the tail 710 of the surfactant 700 having hydrophobicity may be well bonded to the surface of photoresist pattern 140P. Therefore, the tail 710 of the surfactant 700 may be bonded to the upper and side surfaces of the photoresist pattern 140P, and the head 720 of the surfactant 700 may be positioned away from the upper and side surfaces of the photoresist pattern 140P. That is, the head 720 of the surfactant 700 may be positioned apart from the photoresist pattern 140P.

The substrate 100 may be formed of a large area, and the photoresist pattern 140P may be formed on the substrate 100 in a state in which a plurality of layers are already formed. Accordingly, the substrate 100 may have a curved shape in which the center is concave. If the surfactant 700 is supplied to the center of the substrate 100 having this shape, the surfactant 700 may not be uniformly supplied on the substrate 100. For example, the relatively large amount of the surfactant 700 may be supplied to the center and the region close to the center of the substrate 100, and the relatively small amount of surfactant 700 may be supplied to the edge region of the substrate 100.

The cleaning solution is acidic, and the upper surface of the photoresist pattern 140P subjected to the cleaning process using the cleaning solution including the surfactant may be acidic. At this time, the region close to the center of the substrate 100 may have a relatively low pH, and the edge region of the substrate 100 may have a relatively high pH.

Figure 7A:
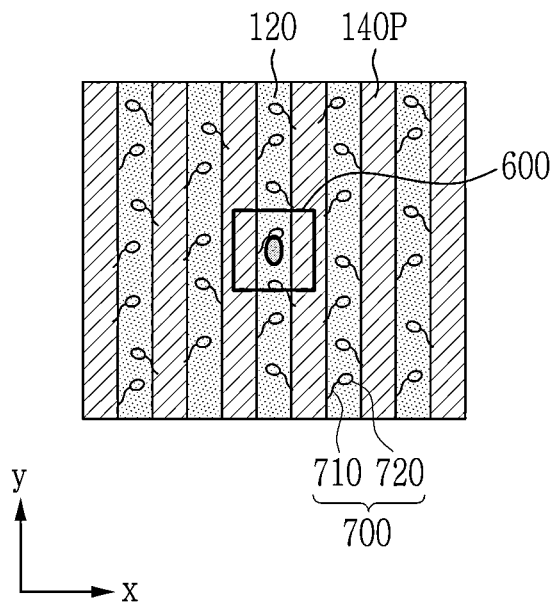
Figure 7B:
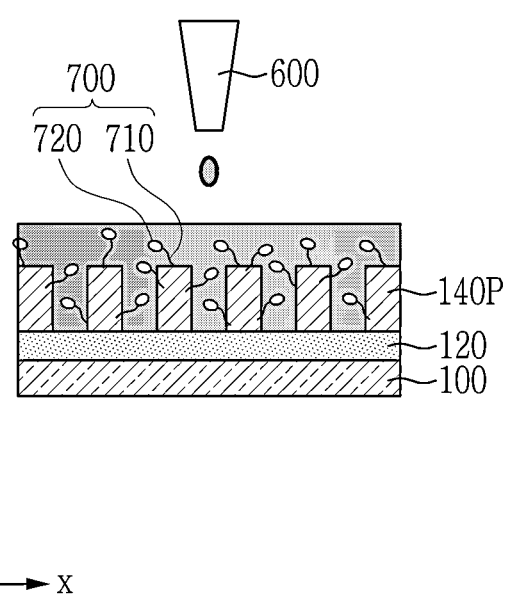

As shown in FIG. 1, FIG. 7A and FIG. 7B, a second deionized water cleaning process is carried out on the photoresist pattern 140P where the cleaning process using the surfactant 700 has been performed. (S1600)

A nozzle 600 capable of supplying deionized water is placed on the substrate 100 on which the photoresist pattern 140P is formed. The nozzle 600 may correspond to the center region of the substrate 100. Subsequently, while rotating the substrate 100 in a certain direction, the deionized water may be supplied from the nozzle 600 onto the substrate 100. At this time, the deionized water cleaning process may proceed for about 1 second to about 2 seconds. For example, the deionized water cleaning process may run for about 1.5 seconds. Also, the substrate 100 may be rotated at a speed of about 200 to about 2000 rpm. However, the supply time of the deionized water, the supply method, the rotation speed of the substrate 100, etc. are not limited thereto and may be variously changed. For example, the supply method of the deionized water may be made by a method such as spraying or dipping.

The deionized water is neutral, and the pH of the deionized water may be about 7. Accordingly, the upper surface of the photoresist pattern 140P where the second deionized water cleaning process has been performed may be neutral. The head 720 of the surfactant 700 is hydrophilic and may be bonded well with the deionized water. Therefore, the remaining surfactant 700 on the photoresist pattern 140P may be easily removed by the deionized water cleaning process. After the deionized water cleaning process is performed, the pH of the upper surface of the photoresist pattern 140P may be about 6 to about 8. For example, the pH of the upper surface of the photoresist pattern 140P may be about 7.

As described above, the pH of the upper surface of the photoresist pattern 140P subjected to the cleaning process using the cleaning solution including the surfactant may be different depending on a location on the substrate. That is, the pH of the center region of the substrate 100 (e.g., close to the center of the substrate 100) may be relatively low, and the pH of the edge region of the substrate 100 may be relatively high. Due to the difference in the pH depending on a location on the substrate, critical dimension uniformity (CDU) of the photoresist pattern 140P may be lowered. In the method of manufacturing the semiconductor device according to an embodiment, the difference in pH depending on a location on the upper surface of the photoresist pattern 140P may be reduced as the second deionized water cleaning process is performed after the cleaning process using the cleaning solution including the surfactant is performed. That is, the pH of the region close to the center of the photoresist pattern 140P may be higher.

Figure 8A:
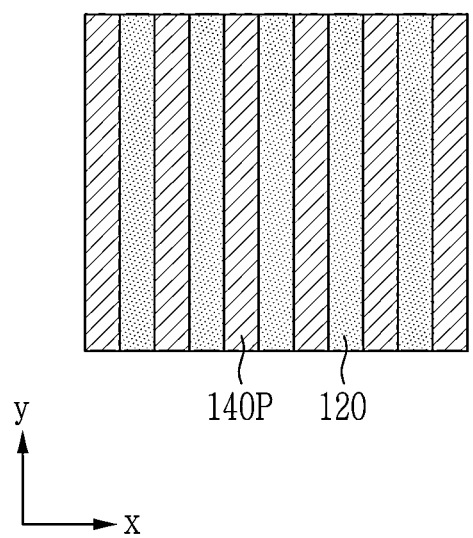
Figure 8B:
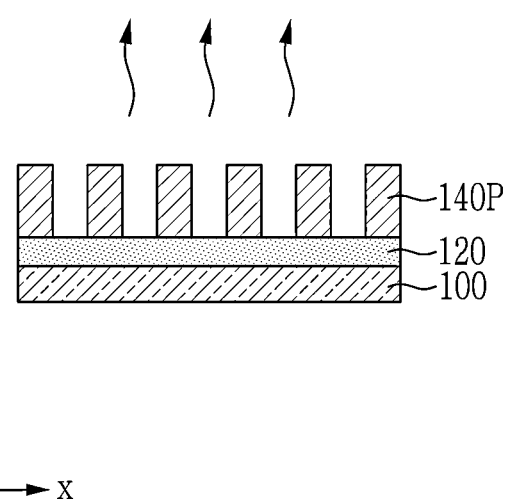

As shown in FIG. 1, FIG. 8A, and FIG. 8B, the photoresist pattern 140P on which the second deionized water cleaning process is performed is subjected to a drying and a hard bake process. (S1700)

After supplying N2 gas on the substrate 100 on which the photoresist pattern 140P is formed, a drying process may be performed. The drying process may run for about 15 seconds. However, the type of gas used in the drying process and the duration of the drying process are not limited thereto and may be variously changed.

Subsequently, a hard bake process is performed on the photoresist pattern 140P in which the drying process has been performed. After the cleaning process is performed through the drying and hard bake processes, moisture such as the remaining cleaning solution and deionized water may be removed from the photoresist pattern 140P. The hard bake process may proceed in an oven at an oven temperature of about 60° C. to about 110° C. Preferably, the hard bake process may be performed at an oven temperature of about 80° C. to about 100° C. As described above, the boiling point of the cleaning solution and deionized water is about 100° C., and if the hard bake process is performed at a temperature exceeding about 100° C., the remaining cleaning solution and deionized water in the photoresist pattern 140P are boiled and become vaporized. In this process, a line width roughness (LWR) of the photoresist pattern 140P may increase. In the method of manufacturing the semiconductor device according to an embodiment, the line width roughness of the photoresist pattern 140P may be improved by performing the hard bake process at about 100° C. or less.

Figure 9A:
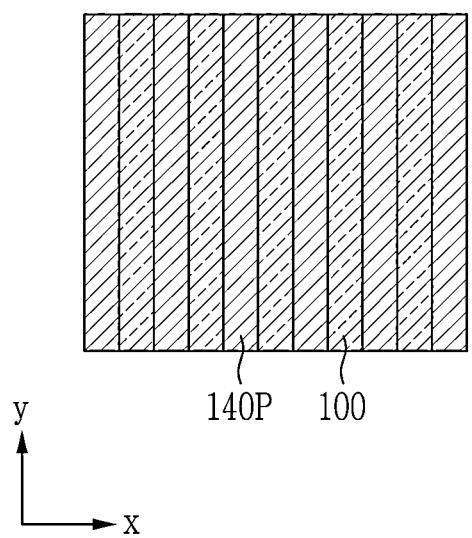
Figure 9B:
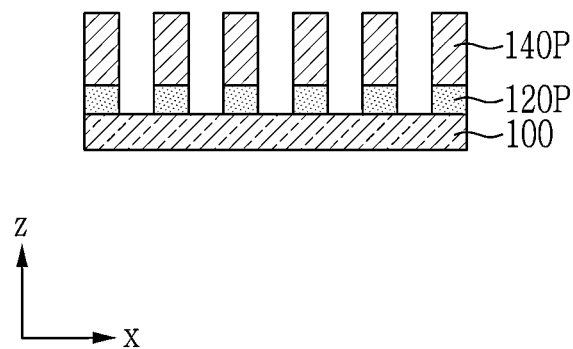

As shown in FIG. 1, FIG. 9A, and FIG. 9B, the pattern formation material layer 120 is etched by using photoresist pattern 140P as a mask to form a pattern 120P. (S1800)

The part of the pattern formation material layer 120 exposed because the photoresist pattern 140P is not positioned is removed, and the other part of the pattern formation material layer 120 positioned under the photoresist pattern 140P remains. The etching method of the pattern formation material layer 120 may be performed in various ways, and for example, dry etching or wet etching may be performed.

Figure 10A:
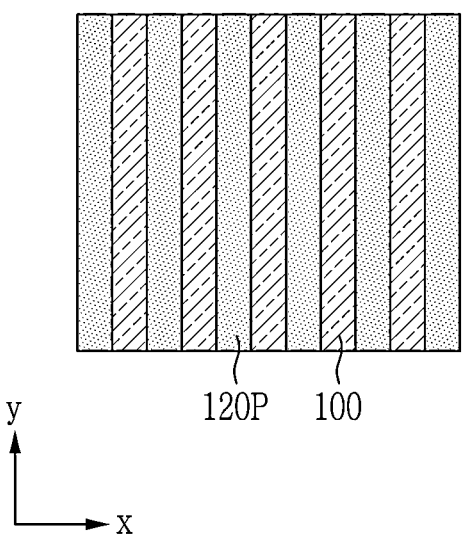
Figure 10B:
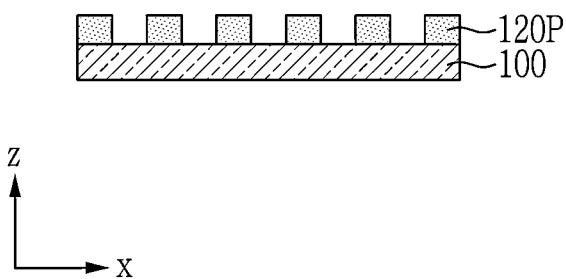

As shown in FIG. 1, FIG. 10A, and FIG. 10B, the photoresist pattern 140P is removed. (S1900)

After performing the etching process, the remaining photoresist pattern 140P on the pattern 120P may be removed using photoresist strip equipment. The photoresist pattern 140P is removed, and the pattern 120P positioned below the photoresist pattern 140P remains on the substrate 100.

Hereinafter, characteristics of a semiconductor device EMB manufactured by the method of manufacturing the semiconductor device according to an embodiment and semiconductor devices REF1 and REF2 according to reference examples are compared and reviewed with reference to Table 1.

Table 1 is a table representing a depth of focus (DoF), line width roughness (LWR), and critical dimension uniformity (CDU) of the semiconductor devices REF1 and REF2 according to the reference example and the semiconductor device EMB according to an embodiment. The depth of focus means the range that may be focused during the exposure process, and the larger the value of depth of focus, the more the process margin may be secured. The line width roughness indicates a variation degree in the pattern width, and as the line width roughness is lower, it may be more advantageous. The critical dimension uniformity indicates the degree of the difference in the pattern width depending on the position on the substrate, and the lower the critical dimension uniformity, the more advantageous it may be.

TABLE 1

|  | REF1 | REF2 | EMB |
|---|---|---|---|
| Depth of focus (nm) | 56 | 79 | 68 |
| Line width roughness (nm) | 1.92 | 1.86 | 1.84 |
| Critical dimension uniformity (nm) | 0.18 | 0.28 | 0.15 |

Reference Example 1 REF1 and the Reference Example 2 REF2 represent the semiconductor device formed by omitting the partial process from the method of manufacturing the semiconductor device according to an embodiment described above. Reference Example 1 REF1 represents a case of omitting the cleaning process using the cleaning solution including the surfactant and the second deionized water cleaning process from the method of manufacturing the semiconductor device according to an embodiment. Reference Example 2 REF2 represents a case of omitting the second deionized water cleaning process from the method of manufacturing the semiconductor device according to an embodiment. The depth of focus DoF of the semiconductor device EMB according to an embodiment is about 68 nm, which is lower than Reference Example 2 REF2, but may be improved compared to Reference Example 1 REF1.

It may be confirmed that the line width roughness LWR of the semiconductor device EMB according to an embodiment is about 1.84 nm, which is improved compared to Reference Example 1 REF1 and Reference Example 2 REF2. As described above, in the method of manufacturing the semiconductor device according to an embodiment, the line width roughness may be improved by appropriately adjusting the temperature of the hard bake after the cleaning process using the cleaning solution including the surfactant and the cleaning process using the deionized water.

It may be confirmed that the critical dimension uniformity CDU of the semiconductor device EMB according to an embodiment is about 0.15 nm, which is improved compared to Reference Example 1 REF1 and Reference Example 2 REF2. As described above, the critical dimension uniformity may be improved by adding the cleaning process using the deionized water after performing the cleaning process using the cleaning solution including the surfactant.

Hereinafter, characteristics of a semiconductor device manufactured by the method of manufacturing the semiconductor device according to an embodiment and the semiconductor device according to the reference example are compared and examined with reference to FIG. 11 to FIG. 13.

Figure 11:
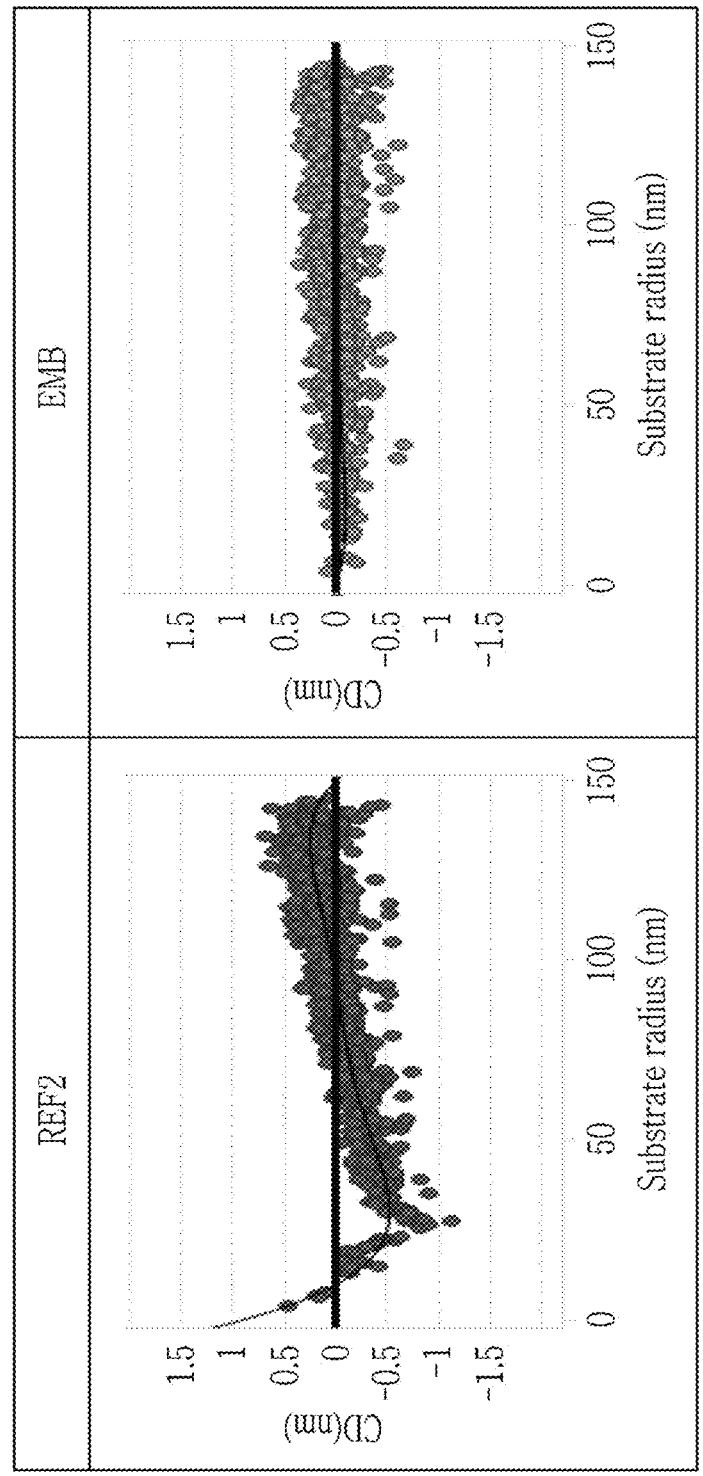
FIG. 11 is a view showing critical dimension uniformity of a semiconductor device according to Reference Example 2 and a semiconductor device according to an embodiment.
Figure 12:
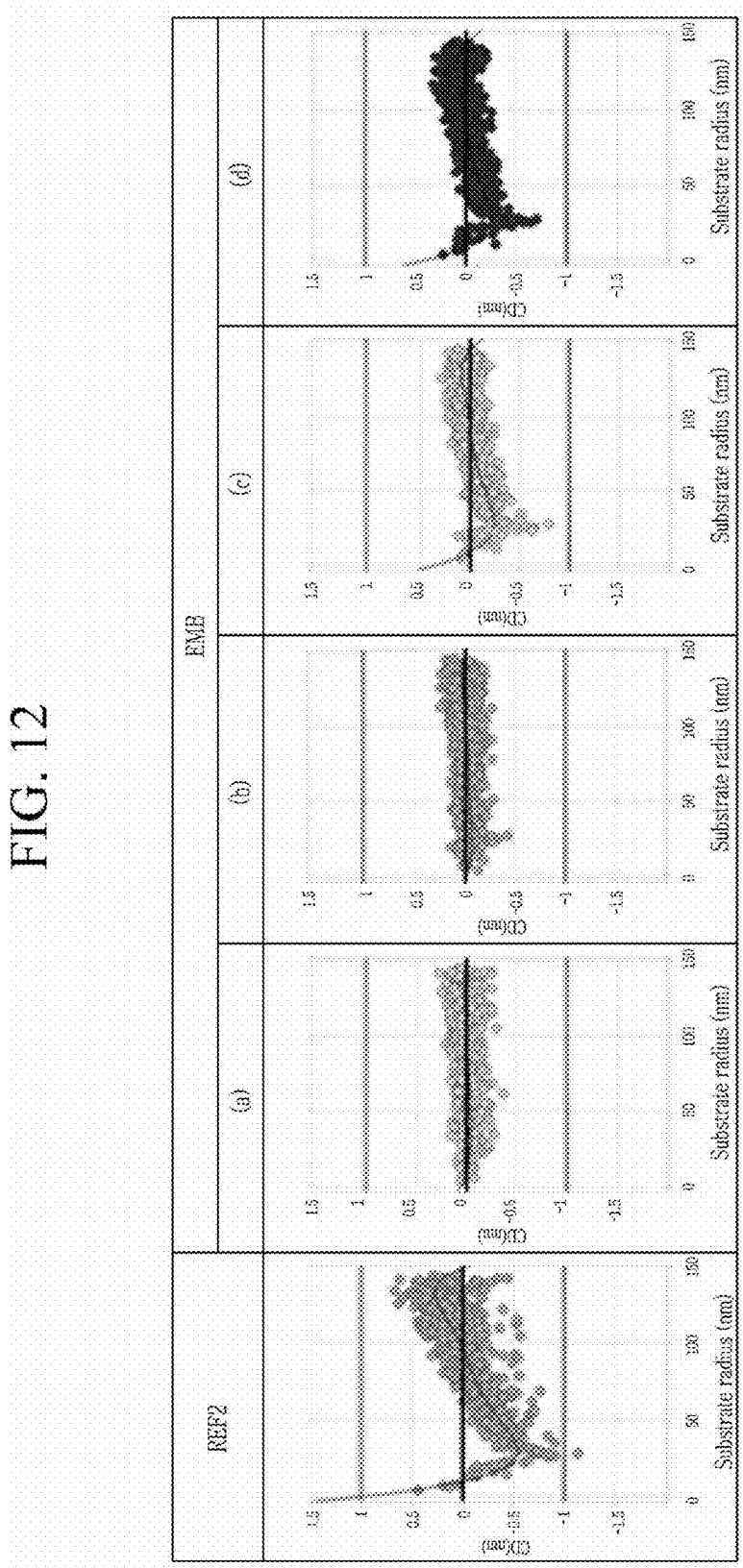
FIG. 12 is a view showing a change in a critical dimension uniformity of a semiconductor device according to the reference example.
Figure 13:
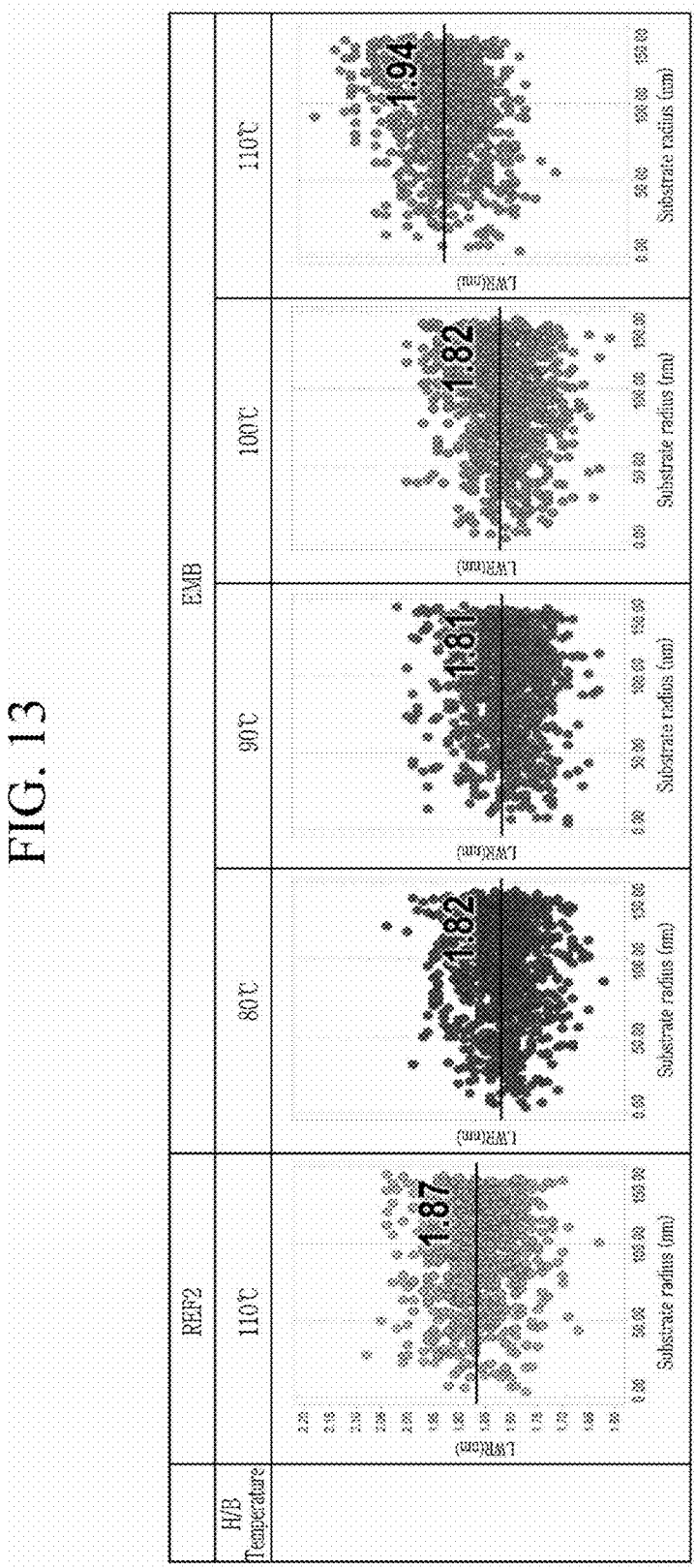
FIG. 13 is a view showing a line width roughness of a semiconductor device according to Reference Example 2 and a semiconductor device according to an embodiment.

FIG. 11 is a view showing a critical dimension uniformity CDU of a semiconductor device REF2 according to Reference Example 2 and a semiconductor device EMB according to an embodiment, FIG. 12 is a view showing a change of a critical dimension uniformity CDU of semiconductor devices REF2, and REFS according to a reference example, and FIG. 13 is a view showing a line width roughness LWR of a semiconductor device REF2 according to Reference Example 2 and a semiconductor device EMB according to an embodiment.

As shown in FIG. 11, the semiconductor device REF2 according to Reference Example 2 is a case where the cleaning process using the deionized water was not performed after the cleaning process using the cleaning solution including the surfactant, and the shape of the photoresist pattern may be different depending on a location on the substrate. This is because the pH of the photoresist pattern is different as the distribution of the surfactant is different depending on a location on the substrate. Particularly, the surfactant may be more distributed in the part closer to the center of the substrate. Therefore, it may be confirmed that the critical dimension is lowered in the region close to the center of the substrate. In the case of the semiconductor device EMB according to an embodiment, it may be confirmed that the critical dimension appears uniformly from the center of the substrate to the edge. That is, the critical dimension uniformity may be improved. This is because the pH difference of the photoresist pattern depending on a location on the substrate may be reduced by additionally conducting the cleaning process using the deionized water after the cleaning process using the cleaning solution including the surfactant.

As shown in FIG. 12, the semiconductor device REF2 according to Reference Example 2 is a case where the cleaning process using the deionized water was not performed after the cleaning process using the cleaning solution including the surfactant, and the hard bake process is performed at about 110° C. At this time, the critical dimension appears low in the region close to the center of the substrate, and the critical dimension uniformity may be relatively high.

For the semiconductor device REF3 according to Reference Example 3, the cleaning process using the deionized water and the hard bake process are omitted after performing the cleaning process using the cleaning solution including the surfactant. At this time, it may be confirmed that the certain critical dimension appears uniformly regardless of a location of the substrate immediately after the cleaning process using the cleaning solution including the surfactant (a). That is, the critical dimension uniformity may be relatively low. (b), (c), and (d) show how the critical dimension changes over time after the cleaning process using the cleaning solution including the surfactant. Even in the case of (b), it may be confirmed that the critical dimension is generally constant, but from (c), it may be confirmed that the critical dimension decreases at a point close to the center of the substrate. In the case of (c) and (d), it may be confirmed that there is a large difference between the critical dimension at the position close to the center of the substrate, e.g., a center region, and the critical dimension at the edge of the substrate (e.g., edge region). In the case of (c) and (d), the critical dimension uniformity may be relatively high.

When the hard bake process is omitted, there is no difference in the critical dimension depending on the position of the substrate at the beginning, but as time passes, it may be confirmed that the critical dimension decreases at the position close to the center of the substrate. When the hard bake process is in progress, the reaction speed between the surfactant and the photoresist pattern is increased by the heat applied in the hard bake process, so it may be quickly confirmed that the critical dimension is lowered at the position close to the center of the substrate.

Accordingly, regardless of whether the hard bake process is in progress, if the cleaning process using the deionized water is not performed after the cleaning process using the cleaning solution including the surfactant, there may be a large difference in the critical dimension depending on a location on the substrate. According to the method of manufacturing the semiconductor device according to an embodiment, the critical dimension uniformity of the photoresist pattern may be improved by performing the cleaning process using the cleaning solution including the surfactant and then performing the cleaning process using the deionized water.

As shown in FIG. 13, the semiconductor device REF2 according to Reference Example 2 is a case where the cleaning process using the deionized water was not performed after the cleaning process using the cleaning solution including the surfactant, and the hard bake process takes place at about 110° C.

In this case, the line width roughness may be about 1.87 nm.

The semiconductor device EMB according to an embodiment is a case in which the cleaning process using the cleaning solution including the surfactant is performed after performing the cleaning process using the deionized water, and then the hard bake process is performed, and various cases depending on the temperature of the hard bake process are represented. The hard bake process temperatures are about 80° C., about 90° C., and about 100° C., and about 110° C., respectively. When the temperature of the hard bake process is about 80° C., about 90° C., and about 100° C., the line width roughness is about 1.82 nm, about 1.81 nm, and about 1.82 nm, respectively, and it may be confirmed that there is an improvement compared to the case of the semiconductor device REF2 according to Reference Example 2. When the temperature of the hard bake process is about 110° C., it may be confirmed that the line width roughness is 1.94 nm, which is higher than that of the semiconductor device REF2 according to Reference Example 2.

The boiling point of the surfactant and the deionized water is about 100° C., and when the hard bake process is performed at about 110° C., the remaining surfactant and deionized water components vaporize around the photoresist pattern, which may cause deformation of the shape of the photoresist pattern. As a result, it may be seen that the line width roughness of the photoresist pattern increases. Therefore, the temperature of the hard bake process in the method of manufacturing the semiconductor device according to an embodiment is preferably made at about 100° C. or less.

Hereinafter, the line width roughness of the photoresist pattern of the semiconductor device according to an embodiment will be examined with reference to Table 2.

Table 2 shows the results of measuring line width roughness over time after performing the hard bake process at about 90° C. after sequentially performing the cleaning process using the cleaning solution including the surfactant and the cleaning process using the deionized water in the method of manufacturing the semiconductor device according to an embodiment.

TABLE 2

| Delay time (hr)          | 0    | 8    | 10   | 24   | 35   | 60   |
|--------------------------|------|------|------|------|------|------|
| Line width roughness (nm)| 1.81 | 1.83 | 1.83 | 1.81 | 1.83 | 1.83 |

It may be confirmed that the line width roughness of the photoresist pattern is about 1.81 nm immediately after the hard bake process, and even after about 8 hours, 10 hours, 24 hours, 35 hours, and 60 hours after the hard bake process, the line width roughness of the photoresist pattern represents a value between about 1.81 nm and 1.83 nm. That is, according to the method of manufacturing the semiconductor device according to an embodiment, it may be confirmed that the line width roughness of the photoresist pattern does not change and appears stably even when time elapses.

While example embodiments have been shown and described above, it will be apparent to those skilled in the art that modifications and variations could be made without departing from the scope of the present inventive concept as defined by the appended claims.

What is claimed is:

1. A method of manufacturing a semiconductor device comprising:
    forming a pattern formation material layer on a substrate;
    forming a photoresist on the pattern formation material layer;
    exposing and developing the photoresist to form a photoresist pattern;
    performing a first deionized water cleaning on the photoresist pattern;
    cleaning the photoresist pattern with a cleaning solution including a surfactant after performing the first deionized water cleaning on the photoresist pattern;
    performing a second deionized water cleaning on the photoresist pattern after cleaning the photoresist pattern and performing the first deionized water cleaning on the photoresist pattern; and directly thereafter
    drying the photoresist pattern and performing a hard bake process thereon, wherein a difference in pH depending on a location on an upper surface of the photoresist pattern is reduced due to the second deionized water cleaning process being performed on the photoresist pattern after cleaning the photoresist pattern with a cleaning solution including the surfactant.

2. The method of manufacturing the semiconductor device of claim 1, wherein
    the surfactant is an acidic negative ionic surfactant.

3. The method of manufacturing the semiconductor device of claim 2, wherein
    the surfactant includes a hydrophobic tail and a hydrophilic head.

4. The method of manufacturing the semiconductor device of claim 3, wherein
    the photoresist pattern has a hydrophobicity,
    the hydrophobic tail of the surfactant is bonded to the photoresist pattern, and the hydrophilic head of the surfactant extends away from the photoresist pattern.

5. The method of manufacturing the semiconductor device of claim 2, wherein
    the cleaning solution including the surfactant further includes water and an additive,
    a water content of the cleaning solution is 99% or more, and
    the additive is a hydrocarbon additive.

6. The method of manufacturing the semiconductor device of claim 2, wherein
    exposing and developing the photoresist to form a photoresist pattern comprises developing the photoresist using a developer comprising a basic aqueous solution.

7. The method of manufacturing the semiconductor device of claim 6, wherein
    an upper surface of the photoresist pattern formed by developing the photoresist is basic.

8. The method of manufacturing the semiconductor device of claim 7, wherein
    the upper surface of the photoresist pattern after the first deionized water cleaning is neutral.

9. The method of manufacturing the semiconductor device of claim 2, wherein
    an upper surface of the photoresist pattern after cleaning the photoresist pattern with the cleaning solution including the surfactant is acidic.

10. The method of manufacturing the semiconductor device of claim 9, wherein
    the upper surface of the photoresist pattern after performing the second deionized water cleaning is neutral.

11. The method of manufacturing the semiconductor device of claim 2, wherein
    a pH of an upper surface of the photoresist pattern after cleaning using the cleaning solution including the surfactant is different based on a location on the substrate.

12. The method of manufacturing the semiconductor device of claim 11, wherein
    a pH of the upper surface of the photoresist pattern in a center region of the substrate is lower than a pH of the upper surface of the photoresist pattern on an edge region of the substrate.

13. The method of manufacturing the semiconductor device of claim 11, wherein
    a pH of the upper surface of the photoresist pattern after performing the second deionized water cleaning is constant regardless of a location on the substrate.

14. The method of manufacturing the semiconductor device of claim 1, wherein
    the hard bake process is at about 60° C. or more and below about 110° C.

15. The method of manufacturing the semiconductor device of claim 14, wherein the hard bake process is at about 80° C. or more and below about 100° C.

16. The method of manufacturing the semiconductor device of claim 1, further comprising
after performing the hard bake process,
etching the pattern formation material layer using the photoresist pattern as a mask, and
removing the photoresist pattern.

17. A method of forming a photoresist pattern comprising:
forming a photoresist on a substrate;
exposing and developing the photoresist to form a photoresist pattern;
performing a first deionized water cleaning on the photoresist pattern;
after performing the first deionized water cleaning on the photoresist pattern, cleaning the photoresist pattern with a cleaning solution including a surfactant;
after cleaning the photoresist pattern, performing a second deionized water cleaning on the photoresist pattern; and directly thereafter
drying the photoresist pattern and performing a hard bake process thereon, wherein a difference in pH depending on a location on an upper surface of the photoresist pattern is reduced due to the second deionized water cleaning process being performed on the photoresist pattern after cleaning the photoresist pattern with a cleaning solution including the surfactant.

18. The method of forming the photoresist pattern of claim 17, wherein
the surfactant comprises an acidic negative ionic surfactant.

19. A method of manufacturing a semiconductor device comprising:
forming a pattern formation material layer on a substrate;
forming a photoresist on the pattern formation material layer;
exposing and developing the photoresist to form a photoresist pattern;
performing a first deionized water cleaning on the photoresist pattern;
after the first deionized water cleaning on the photoresist pattern, further cleaning the photoresist pattern with a cleaning solution including a surfactant;
after the cleaning the photoresist pattern with the cleaning solution including the surfactant, performing a second deionized water cleaning on the photoresist pattern; and directly thereafter
drying the photoresist pattern and performing a hard bake process thereon, wherein a difference in pH depending on a location on an upper surface of the photoresist pattern is reduced due to the second deionized water cleaning process being performed on the photoresist pattern after cleaning the photoresist pattern with a cleaning solution including the surfactant.

* * * * *